(12) United States Patent
Xu et al.

(10) Patent No.: US 11,588,025 B2
(45) Date of Patent: Feb. 21, 2023

(54) SEMICONDUCTOR DEVICE AND MANUFACTURING METHOD THEREOF

(71) Applicant: SHANGHAI HUALI MICROELECTRONICS CORPORATION, Shanghai (CN)

(72) Inventors: Pengkai Xu, Shanghai (CN); Fulong Qiao, Shanghai (CN); Jia Ren, Shanghai (CN)

(73) Assignee: SHANGHAI HUALI MICROELECTRONICS CORPORATION, Shanghai (CN)

(*) Notice: Subject to any disclaimer, the term of this patent is extended or adjusted under 35 U.S.C. 154(b) by 50 days.

(21) Appl. No.: 17/388,842

(22) Filed: Jul. 29, 2021

(65) Prior Publication Data
US 2022/0045179 A1    Feb. 10, 2022

(30) Foreign Application Priority Data
Aug. 6, 2020  (CN) .......................... 202010783067.2

(51) Int. Cl.
*H01L 27/11524* (2017.01)
*H01L 29/423* (2006.01)
(Continued)

(52) U.S. Cl.
CPC .. *H01L 29/40114* (2019.08); *H01L 27/11524* (2013.01); *H01L 29/42324* (2013.01); *H01L 29/66825* (2013.01); *H01L 29/788* (2013.01)

(58) Field of Classification Search
CPC ......... H01L 29/42324; H01L 29/66825; H01L 29/401; H01L 27/115–11556; H01L 29/788–7889; H01L 21/02642; H01L 21/027–0338; H01L 21/0465; H01L 21/266; H01L 21/308–3088; H01L 21/31056; H01L 21/31144; H01L 21/32; H01L 21/32139; H01L 21/426; H01L 21/467; H01L 21/469–47576; H01L 21/7688
See application file for complete search history.

(56) References Cited

U.S. PATENT DOCUMENTS

2013/0049098 A1* 2/2013 Izumi .................. H01L 29/7881
                                                    438/514
2017/0125431 A1* 5/2017 Chen ................. H01L 21/31116

* cited by examiner

*Primary Examiner* — Steven B Gauthier
*Assistant Examiner* — Candice Chan
(74) *Attorney, Agent, or Firm* — Alston & Bird LLP

(57) ABSTRACT

The present disclosure provides a semiconductor device and a manufacturing method thereof. The manufacturing method comprises: providing a substrate comprising a storage region, forming stacked gates of storage transistors on the substrate; forming side walls on two sides of each stacked gate wherein the top surfaces of side walls are arranged to be lower than the top surfaces of the stacked gates; performing ion implantation in the storage region defined by the side walls; and performing an ashing process and a wet cleaning process using the side walls as protective layers of the stacked gates to remove a photoresist remaining after the ion implantation. The present disclosure further provides a semiconductor device formed according to the manufacturing method. According to the semiconductor device and the manufacturing method thereof, the problem of stacked gate collapse from the ion implantation process can be solved, thereby improving the yield.

10 Claims, 19 Drawing Sheets

(51) Int. Cl.
*H01L 29/66* (2006.01)
*H01L 29/788* (2006.01)
*H01L 21/28* (2006.01)

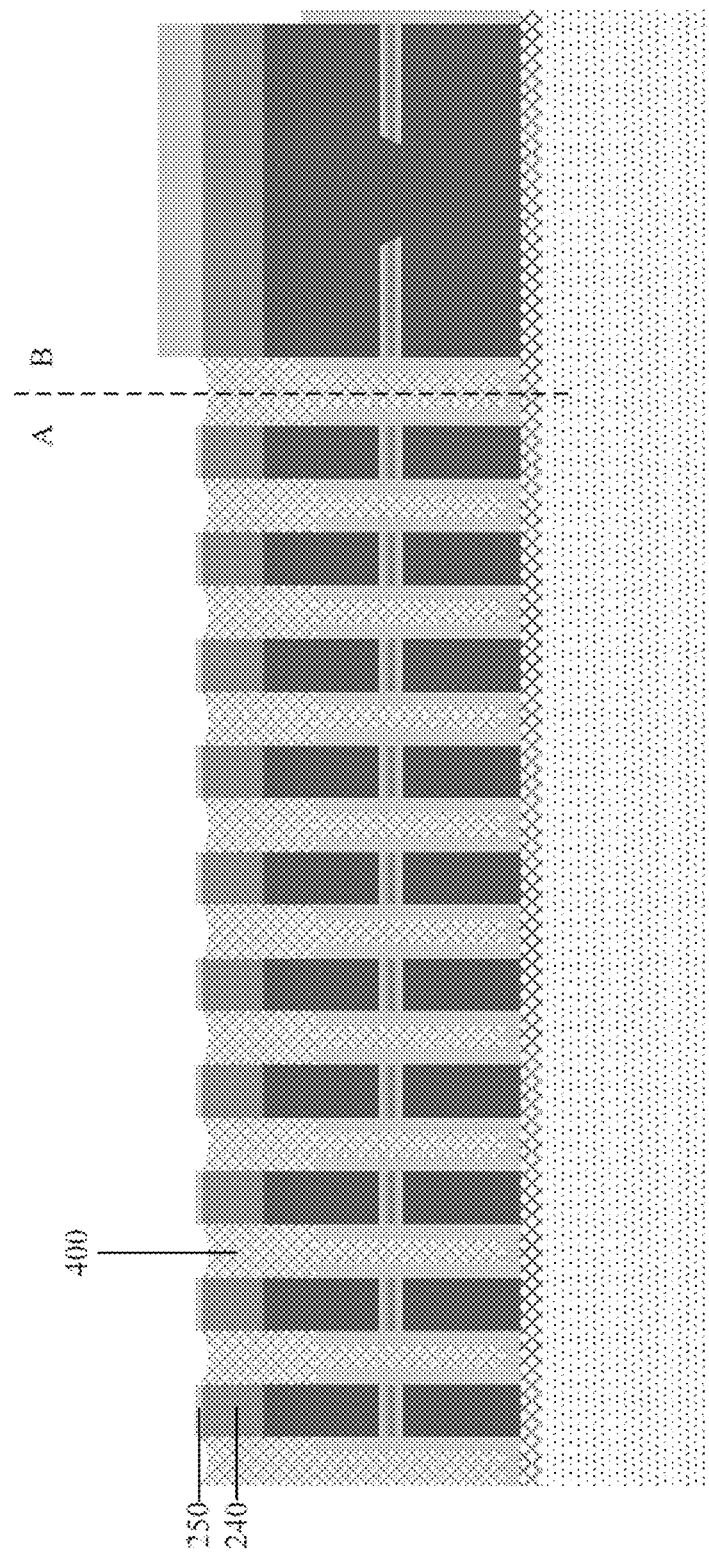

SEMICONDUCTOR DEVICE AND MANUFACTURING METHOD THEREOF

CROSS-REFERENCES TO RELATED APPLICATIONS

This application claims the priority to Chinese patent application No. CN202010783067.2, filed on Aug. 6, 2020 and entitled "SEMICONDUCTOR DEVICE AND MANUFACTURING METHOD THEREOF", the disclosure of which is incorporated herein by reference in its entirety.

TECHNICAL FIELD

The present disclosure relates to the field of semiconductor devices and manufacturing methods thereof, in particular, to a flash device and a manufacturing method thereof.

BACKGROUND

Since doctor Jack Kilby of Texas Instruments invented an integrated circuit in the early days, scientists and engineers have made many inventions and improvements on semiconductor devices and processes. In the past 50 years, the sizes of semiconductor transistors have been significantly reduced, which has led to a growing processing speed and continuously reduced power consumption. So far, the development of semiconductors roughly follows the Moore's law. The Moore's law generally refers to doubling of the number of transistors in integrated circuits about every two years. Now, the semiconductor process is developing towards 20 nm or below, and some companies are starting 14 nm processes. Here is only a reference: a silicon atom is about 0.2 nm, which means that the distance between two independent components produced by the 20 nm process is only about one hundred silicon atoms. The manufacturing of semiconductor devices has thus become increasingly challenging and advanced towards physically possible limits.

NAND flash devices have received a lot of attention due to their advantages of high storage density and continuous size reduction. As described above, with the development of semiconductor technology, nodes of the NAND flash technology have been constantly advancing, and the sizes of storage gates and gaps between the storage gates have been constantly reduced. As a result, the height-width aspect ratio of the gate has significantly increased.

In the manufacturing process of the traditional NAND flash device, after gates are formed, a side wall oxide layer needs to be deposited to facilitate the subsequent protection of the interlayer dielectric layers of the gates while defining a subsequent ion implantation range and the gaps between adjacent gates. However, because the oxide layer on the side walls has hydrophilic characteristic, the subsequent wet cleaning process produces a large torque to the gates. Particularly, in the case where the sizes of gaps between adjacent gates are inconsistent, the difference in gap sizes on both sides of the gate will cause torque imbalance on two sides of the gate, thereby intensifying the impact of the torque on the gate itself. This imbalanced surface tension is very likely to incline the gate structures, and even more seriously cause the problem of collapse of the gate structures.

The problem of collapse of the gate structures in the existing process is illustrated in conjunction with FIGS. 1A-1H. After a gate etching process, gate structures of different sizes are formed, including gates as storage transistors in a storage region A and a gate as a peripheral device in a peripheral region B. The stacked gates 200 of the storage transistors in the storage region A have large height-width aspect ratios. In order to remove the polymer remaining after etching, a wet cleaning process is required, as shown in FIG. 1A. The stacked gate structure after etching sequentially includes polysilicon of a floating gate 210, an interlayer dielectric layer 220 (mainly composed of silicon oxide and silicon nitride), and polysilicon of a control gate 230 arranged from bottom to top. It could be appreciated that, due to process requirements, a silicon nitride mask layer 240 and an insulating layer 250 (silicon oxide material) that is left after etching may be further formed above the stacked gate 200, and the stacked gate 200 and the silicon nitride mask layer 240 and insulating layer 250 thereon constitute a stacked film structure. Since silicon oxide is a hydrophilic material, the chemical reagent used in wet cleaning will produce tension on the upper portion of the stacked film structure.

After the above wet process, although the wet cleaning reagent 400 produces tension on the upper portion of the stacked film structure, the remaining insulating layer 250 and the silicon nitride mask layer 240 are thin, and the resulting torque is small, so the stacked film structure is still normal after the above wet process, as shown in FIG. 1B.

Silicon oxide of side walls 310 is then deposited on. The silicon oxide medium is deposited on the side and upper of the stacked film structure and the region above the substrate, as shown in FIG. 1C. The side walls 310 can protect the interlayer dielectric layers of the gate in the subsequent process while defining a subsequent ion implantation range and the distance between the gates.

In the existing NAND flash process, ion implantation is required for the storage region A. In this step, coating with a photoresist 500 and patterning are required to completely open the storage region A, as shown in FIG. 1D. Subsequently, as shown in FIG. 1E, the region that is not blocked by the photoresist 500 is subjected to the ion implantation process. After the ion implantation process, as shown in FIG. 1F, the photoresist is completely removed.

As shown in FIG. 1G, after the ion implantation process, a wet cleaning is required to remove the residual photoresist. It can be seen by comparing FIG. 1A with FIG. 1G that, in the presence of the side walls 310 of the silicon oxide material, especially the presence of side wall silicon oxide on the top of the stacked film structure, the reagent increases the torque of the stacked film structure. That is, the effect of the surface tension of the reagent on the stacked film structure is enhanced. In addition, because the sizes of the gaps on both sides of the stacked film structure are different (the influence of even-odd effect), the reagent tension torque received by the stacked film structure is different, and after the surface tension is enhanced, the stacked film structure easily collapses, as shown in FIG. 1H.

In view of this, a semiconductor device and a manufacturing method thereof are urgently needed, which can retain the effects of protecting interlayer dielectric layers of gates and defining a subsequent ion implantation range and the distance between the gates by side walls, and eliminate the problem of collapse of the stacked gates in the stacked film structures due to the intensification of tension torque by the side walls.

BRIEF SUMMARY

A brief summary of one or more embodiments is provided below to provide basic understanding of these embodiments. This summary is not a detailed overview of all conceived embodiments, and is not intended to identify critical or decisive factors of all embodiments or to try to define the scope of any or all embodiments. One or more embodiments are disclosed briefly and more detailed descriptions are provide in later sections.

To solve the problem of stacked gates collapse in the presence of side walls, the present disclosure provides a method for manufacturing a semiconductor device, specifically including:

providing a substrate, and forming a plurality of stacked gates of storage transistors on the substrate of a storage region;

forming side walls lower than the stacked gates on two sides of each stacked gate;

performing ion implantation of the storage region on ion implantation regions defined by the side walls; and performing an ashing process and a wet cleaning process using the side walls as protective layers of the stacked gates to remove a photoresist remaining after the ion implantation.

In an embodiment of the manufacturing method, optionally, the stacked gate includes:

a floating gate film, an interlayer dielectric layer and a control gate film sequentially formed over the substrate from bottom to top; wherein the side walls are higher than the interlayer dielectric layer.

In an embodiment of the manufacturing method, optionally, forming the side walls further includes:

forming an insulating thin layer covering the upper and two sides of the stacked gates;

forming a barrier layer on the surface of the insulating thin layer, the barrier layer filling lower parts of gaps between the plurality of stacked gates;

etching the insulating thin layer on the upper of the stacked gate and the upper part of the insulating thin layer on the two sides of the stacked gate, using the barrier layer as a protective layer; and removing the barrier layer; wherein the insulating layer protected by the barrier layer on the lower parts of the two sides of the stacked gate forms the side walls.

In an embodiment of the manufacturing method, optionally, forming the barrier layer further includes:

forming a barrier layer that fills the gaps between the plurality of stacked gates and is higher than the stacked gates, on the surface of the insulating thin layer; and etching back the barrier layer to retain the barrier layer that fills the lower parts of the gaps between the plurality of stacked gates.

In an embodiment of the manufacturing method, optionally, the barrier layer is an organic dielectric layer.

In an embodiment of the manufacturing method, optionally, the insulating thin layer on the upper of the stacked gates and the upper part of the insulating thin layer on the two sides of the stacked gate is etched by means of a wet process.

In an embodiment of the manufacturing method, optionally, the insulating thin layer formed further includes a horizontal portion covering the upper surface of the substrate, and the horizontal portion is protected by the barrier layer.

In an embodiment of the manufacturing method, optionally, the insulating thin layer is silicon oxide.

In an embodiment of the manufacturing method, optionally, a reagent used for wet cleaning of the storage region fills the gaps between the plurality of stacked gates.

Another embodiment of the present disclosure provides a semiconductor device, and the semiconductor device is manufactured by any manufacturing method described above.

According to the method for manufacturing a semiconductor device provided on one embodiment of the present disclosure, the process flow is optimized. Compared with the prior art, the interlayer dielectric layer is protected from being affected by the subsequent wet cleaning process, and the torque produced by the wet cleaning reagent on stacked film structures where the stacked gates are located is reduced, thereby avoiding the problem of collapse of the stacked gates. Meanwhile, since the side walls at the bottoms of the stacked gates are retained, the subsequent ion implantation process will not be significantly affected. According to the semiconductor device provided by another aspect of the present disclosure, the problem of collapse of the stacked gates is avoided, the interlayer dielectric layer can be protected, and the ion implantation is not affected, so the yield of the semiconductor device can be ensured.

BRIEF DESCRIPTION OF THE DRAWINGS

The above features and advantages of the present disclosure can be better understood with the detailed descriptions of the embodiments of the present disclosure in conjunction with the following drawings. In the drawings, each component is not necessarily drawn to scale, and the components having similar related characteristics or features may have the same or similar reference numerals.

FIGS. 3A-3J illustrate schematic structural diagrams of storage transistor gates of flash devices after major steps during a manufacturing process according to one embodiment of the present disclosure.

REFERENCE NUMBERS IN THE FIGURES

Figure 1A:
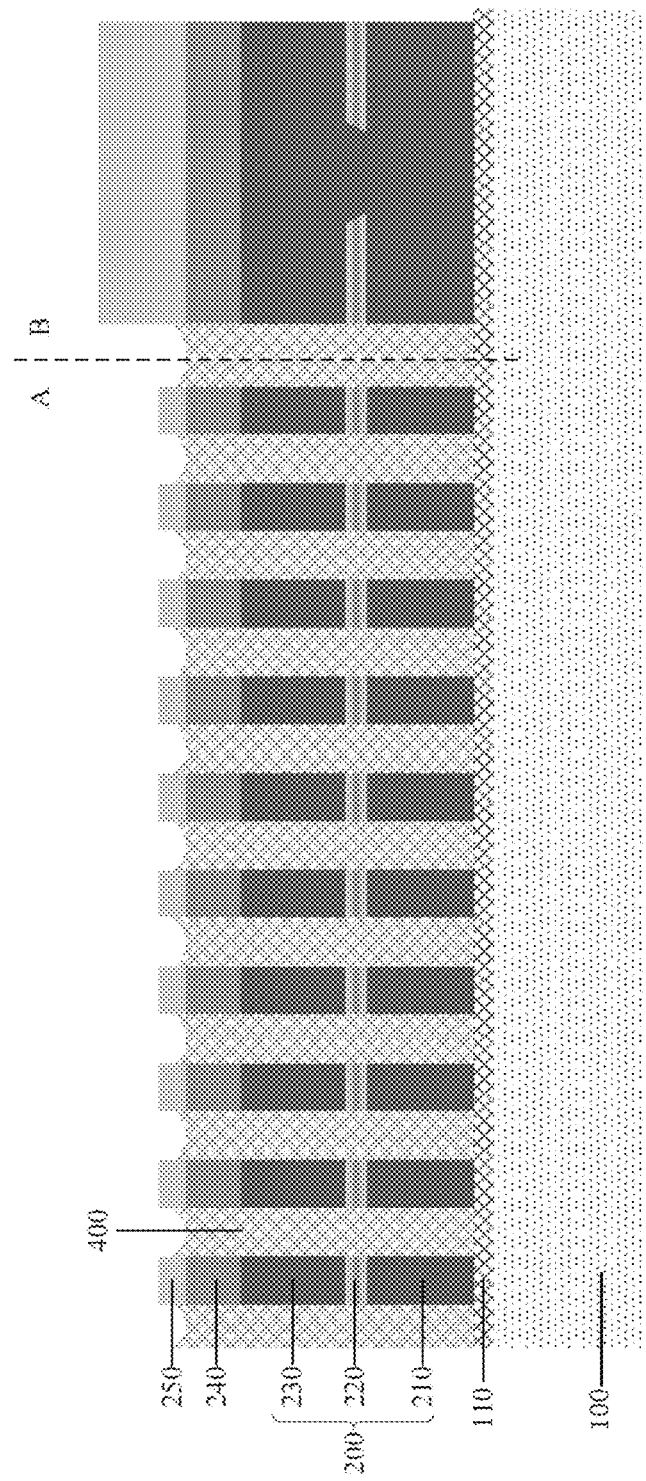
FIGS. 1A-1H illustrate schematic structural diagrams of storage transistor gates of flash devices after major steps during a manufacturing process according to some existing arts.
Figure 1B:
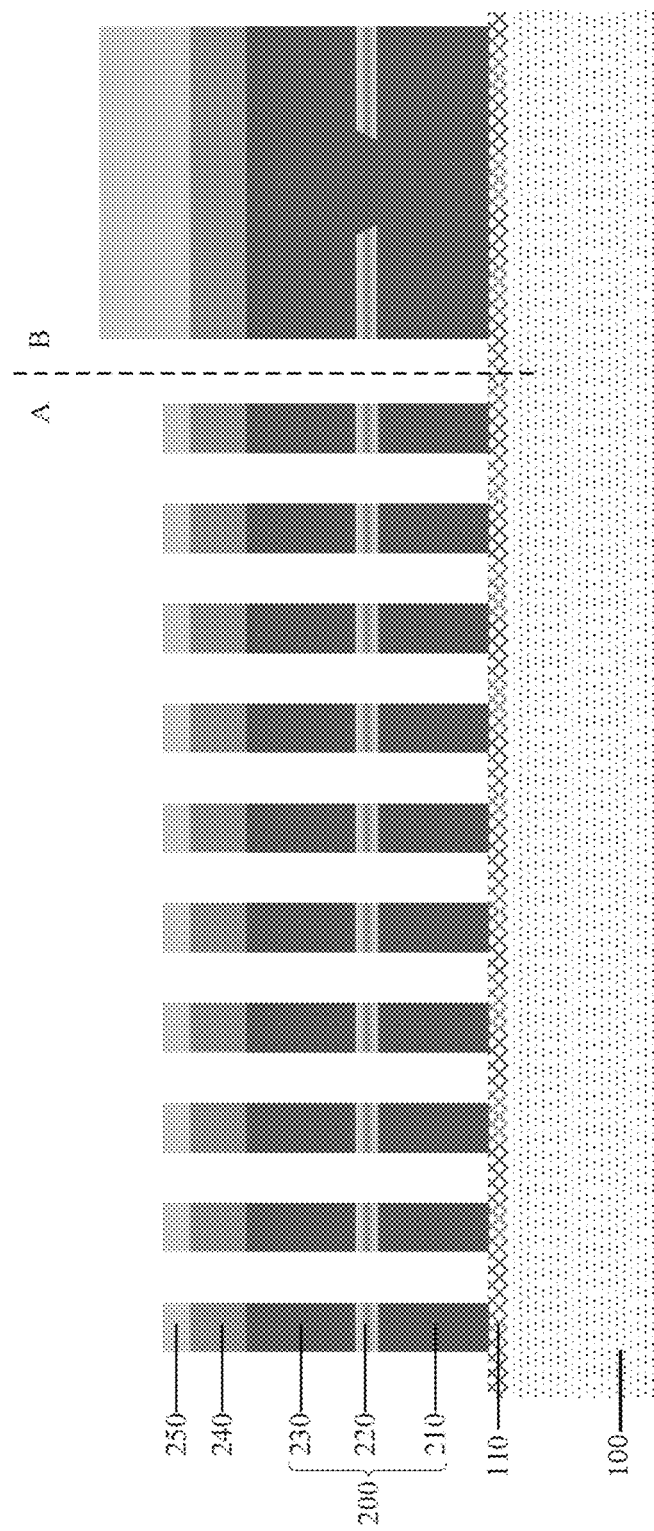
Figure 1C:
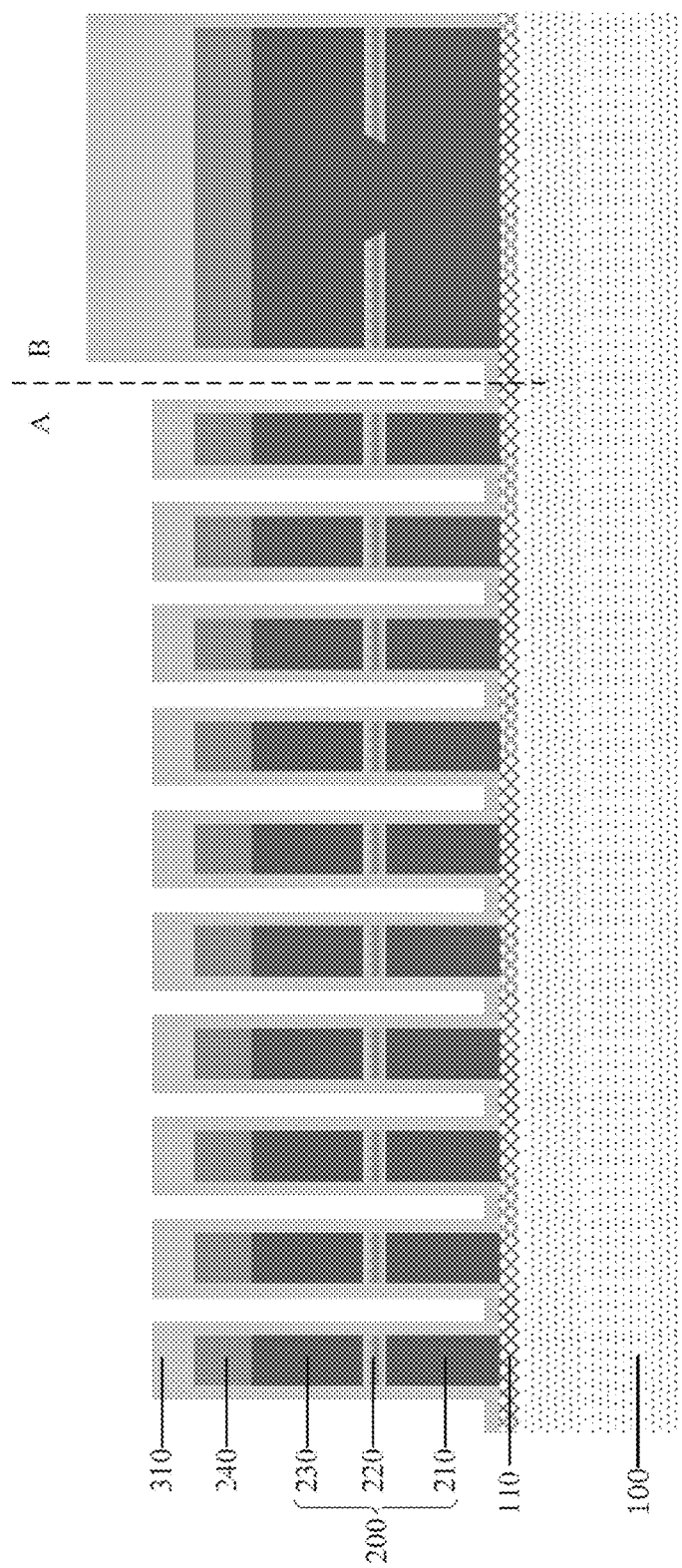
Figure 1D:
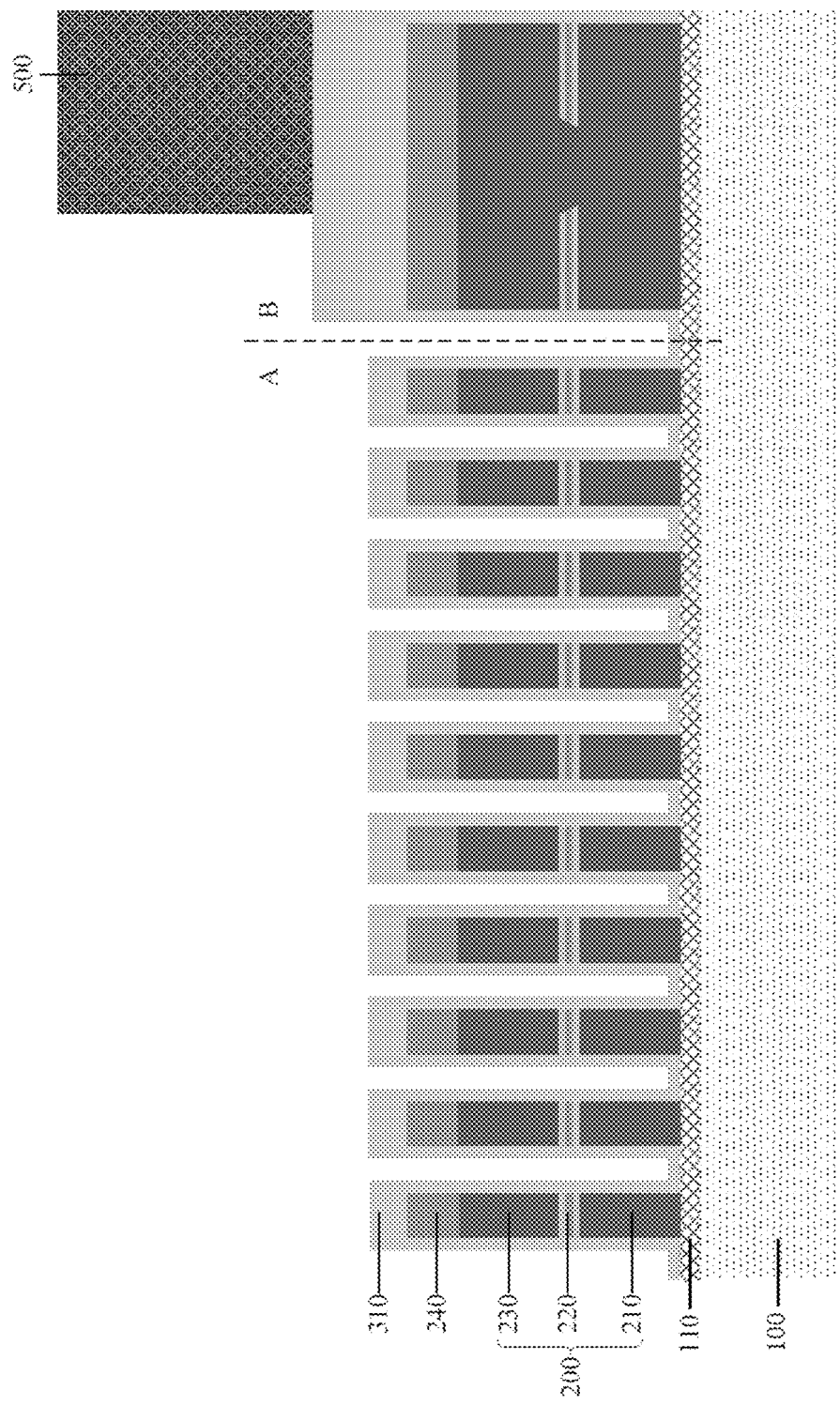
Figure 1E:
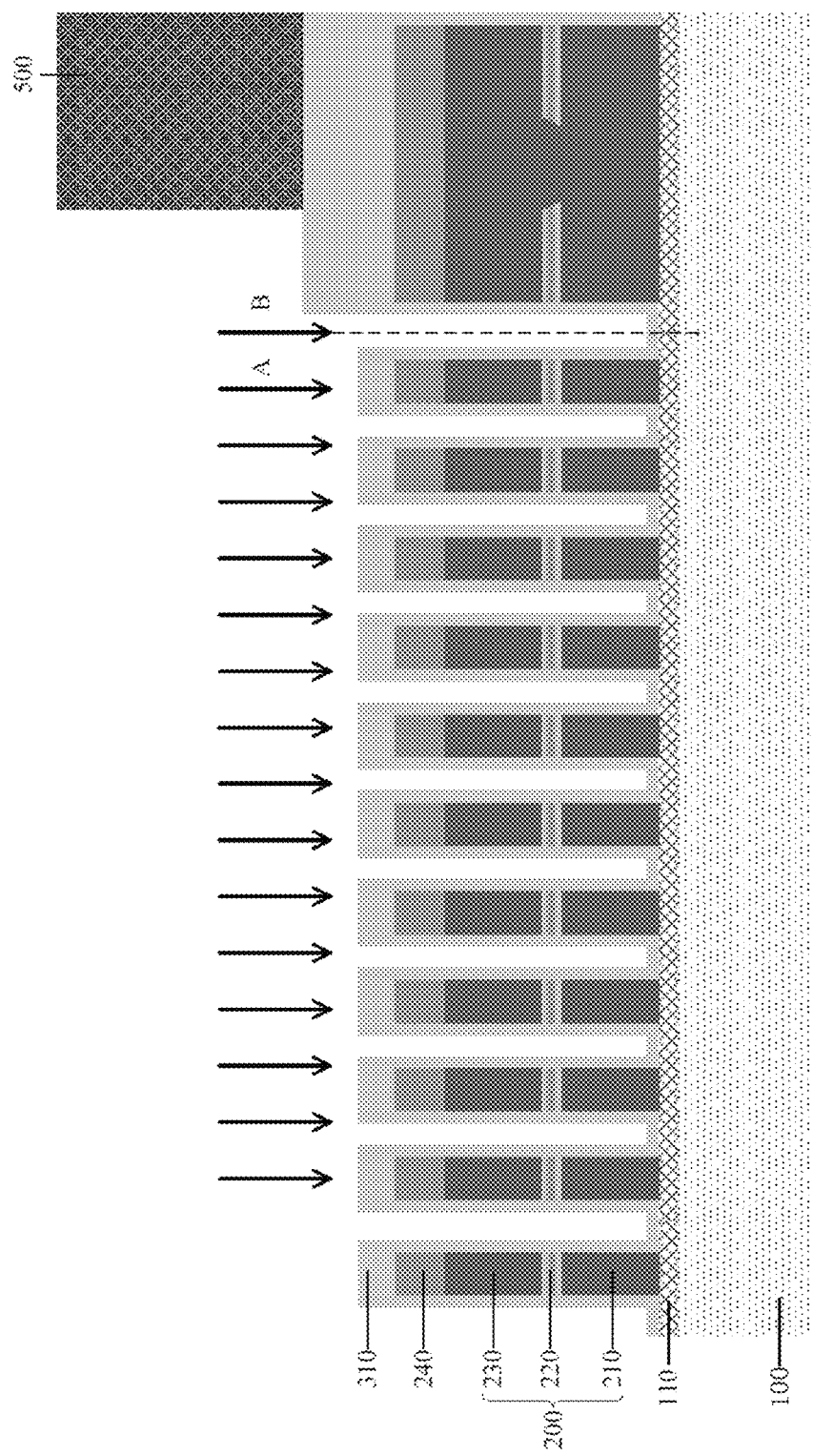
Figure 1F:
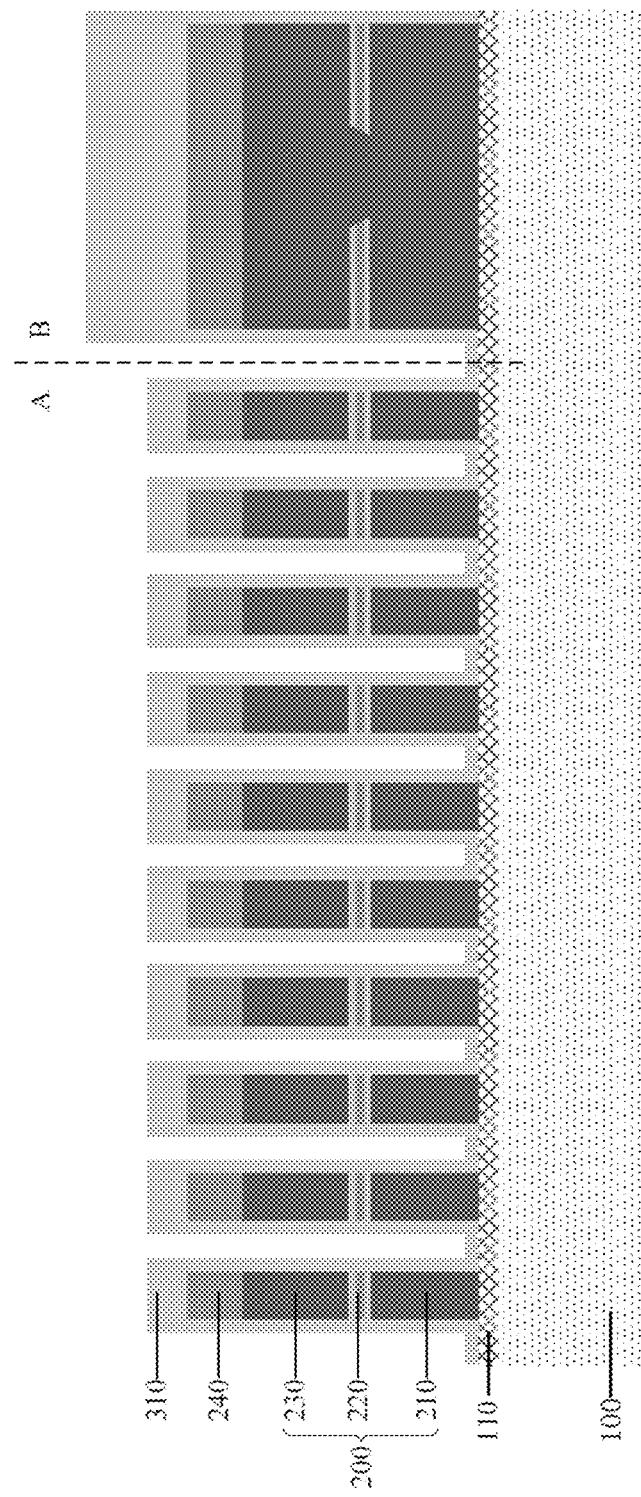
Figure 1G:
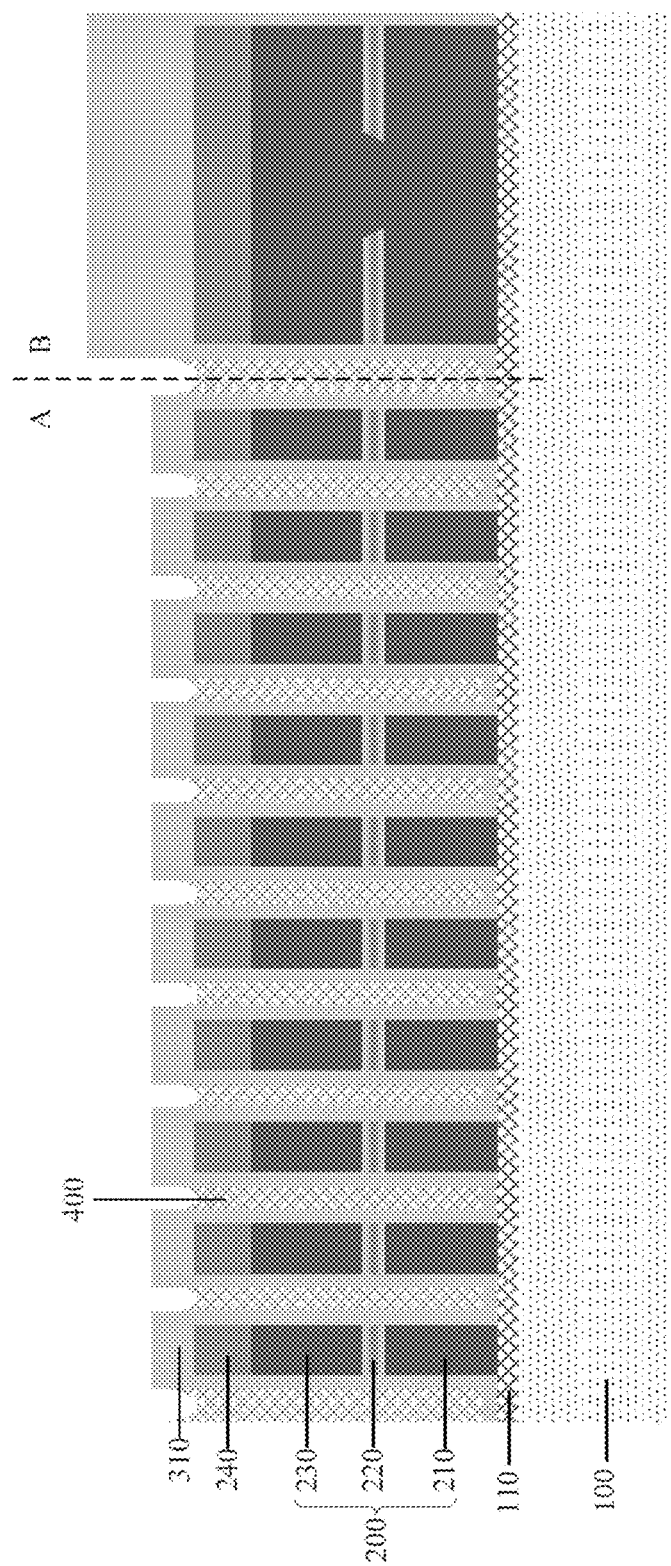
Figure 1H:
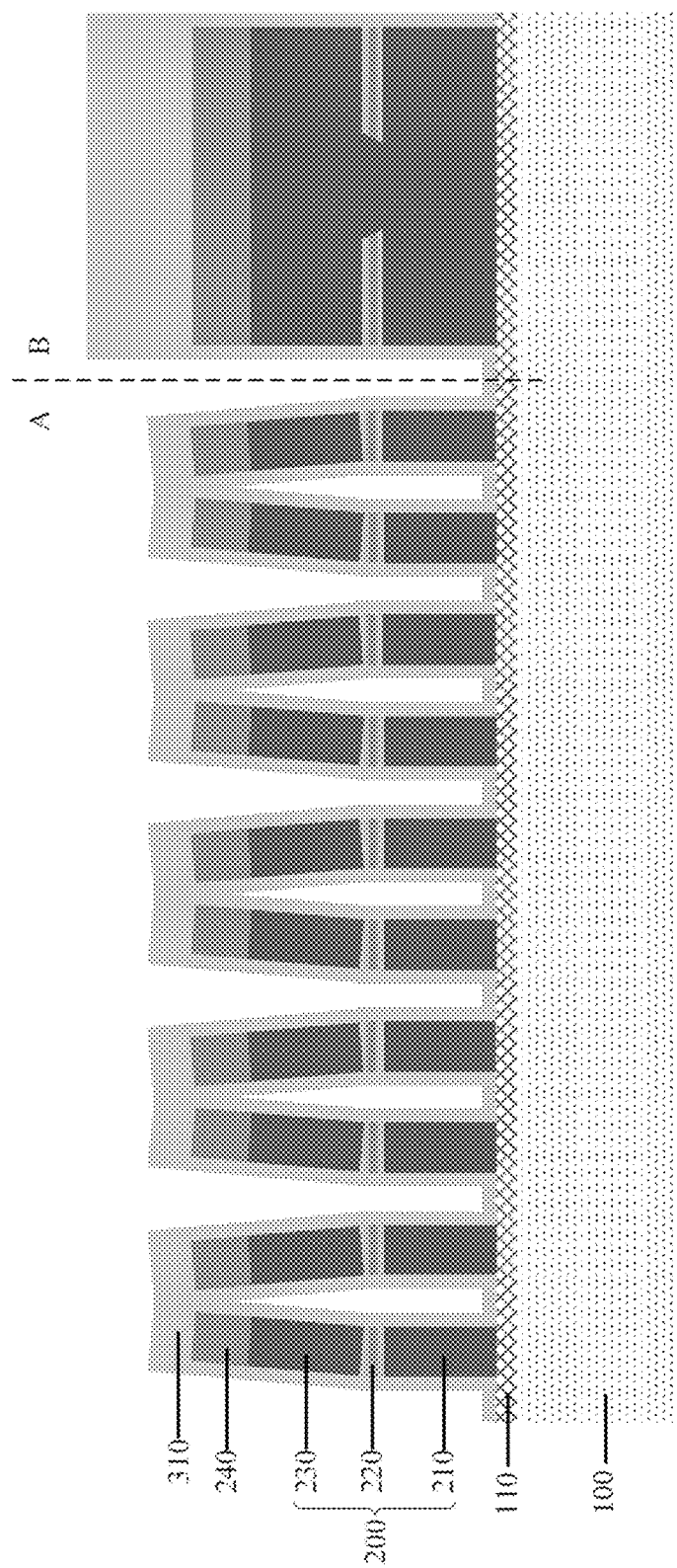

100 Substrate
110 Gate dielectric layer
200 Stacked gate
210 Floating gate film
220 Interlayer dielectric layer
230 Control gate film
240 Silicon nitride mask layer
250 Insulating layer
310 Side wall
320 Insulating thin layer
330 Side wall
400 Cleaning reagent
500 Photoresist
600 Organic dielectric layer
610 Barrier layer

DETAILED DESCRIPTION OF THE DISCLOSURE

The following description is provided so that those skilled in the art can implement and use the present disclosure and combine it into a specific application background. Various modifications, and various uses in different applications will be readily apparent to those skilled in the art, and the general principles defined herein can be applied to a wide range of embodiments. Thus, the present disclosure is not limited to the embodiments given herein, but should be granted in the broadest scope of the principles and novel features disclosed herein.

Many specific details are set forth in the following detailed description to provide a thorough understanding of the present disclosure. However, it would be apparent to those skilled in the art that the practice of the present disclosure is not necessarily limited to these specific details. In other words, the well-known structures and devices are shown in the form of block diagrams without details to avoid obscuring the present disclosure.

Readers should pay attention to all documents and literature that are simultaneously submitted with this description and are open to the public to consult this description, and all such documents and literature are incorporated herein by reference. All features disclosed in this description (including any of the appended claims, abstract, and drawings) can be substituted by alternative features for achieving the same, equivalent or similar purposes, unless otherwise directly stated. Therefore, each feature disclosed is only an example of a group of equivalent or similar features, unless otherwise specified.

It should be noted that, in the case of use, the signs left, right, front, rear, top, bottom, positive, reverse, clockwise and counterclockwise are only used for convenient purposes, but do not imply any specific direction. In fact, they are used to reflect the relative position and/or direction between individual parts of an object.

The terms "over", "under", "between" and "on" as used herein refer to the relative position of this layer relative to other layers. Similarly, for example, a layer deposited or placed over or under other layer can be in direct contact with the other layer or there can be one or more intermediate layers therebetween. Further, a layer deposited or placed over or under other layers can be in direct contact with the other layers or there can be one or more intermediate layers therebetween. In contrast, the first layer "over" the second layer is in contact with the second layer. Further, the relative position of a layer relative to other layer is provided (assuming operations of depositing, modifying and removing a film relative to an initial substrate without considering the absolute orientation of the substrate).

The present disclosure will be described in detail below with reference to the accompanying drawings and specific embodiments. It should be noted that all embodiments described below with reference to the accompanying drawings and specific embodiments are merely exemplary, and should not be construed as any limitation to the protection scope of the present disclosure.

Figure 2:
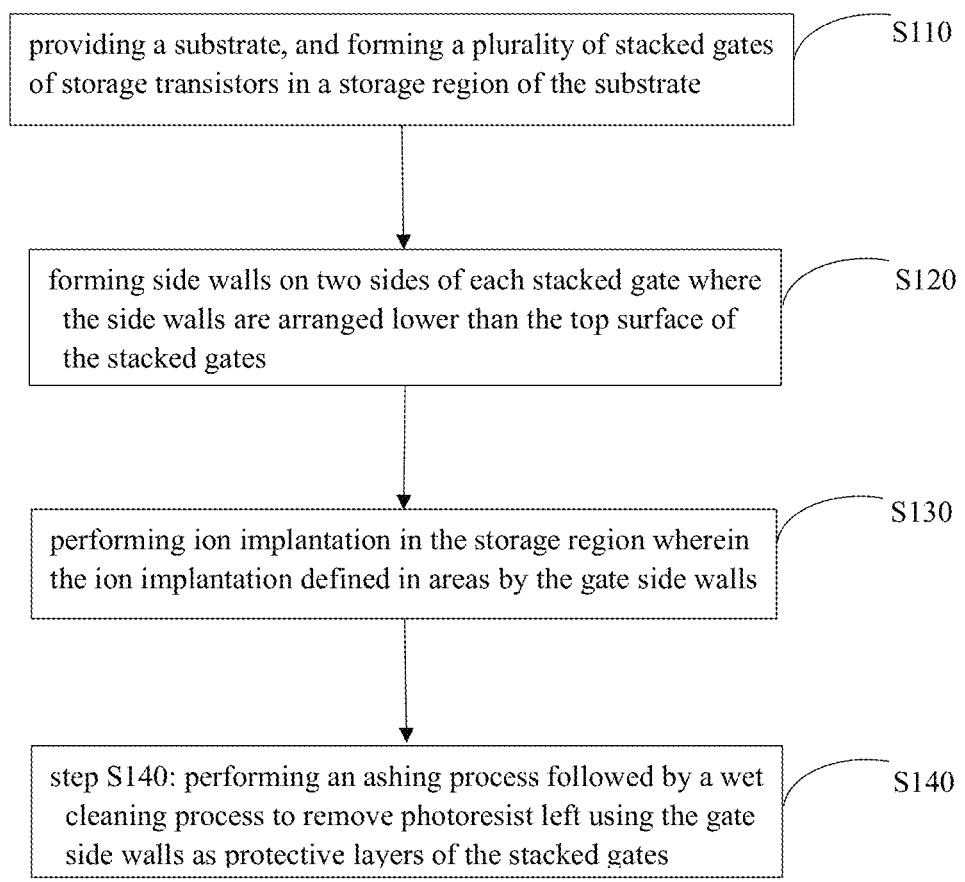
FIG. 2 shows a schematic flowchart of a manufacturing method provided according to one embodiment of the present disclosure.

As described above, to solve the problem of gate collapse during processing storage transistor gates of flash devices in the existing art, the present disclosure provides a method for manufacturing a semiconductor device. The flowchart shown in FIG. 2 is referred to understand the manufacturing method provided by the present disclosure. As shown in FIG. 2, the manufacturing method provided by one embodiment of the present disclosure includes step S110: providing a substrate, and forming a plurality of stacked gates of storage transistors in a storage region of the substrate; step S120: forming side walls on two sides of each stacked gate where the side walls are arranged lower than the top surface of the stacked gates; step S130: performing ion implantation in the storage region wherein the ion implantation defined in areas by the gate side walls; and step S140: performing an ashing process followed by a wet cleaning process to remove photoresist left using the gate side walls as protective layers of the stacked gates.

The ashing process involves an oxygen containing plasma reaction to burn the photoresist so as to remove it.

Figure 3A:
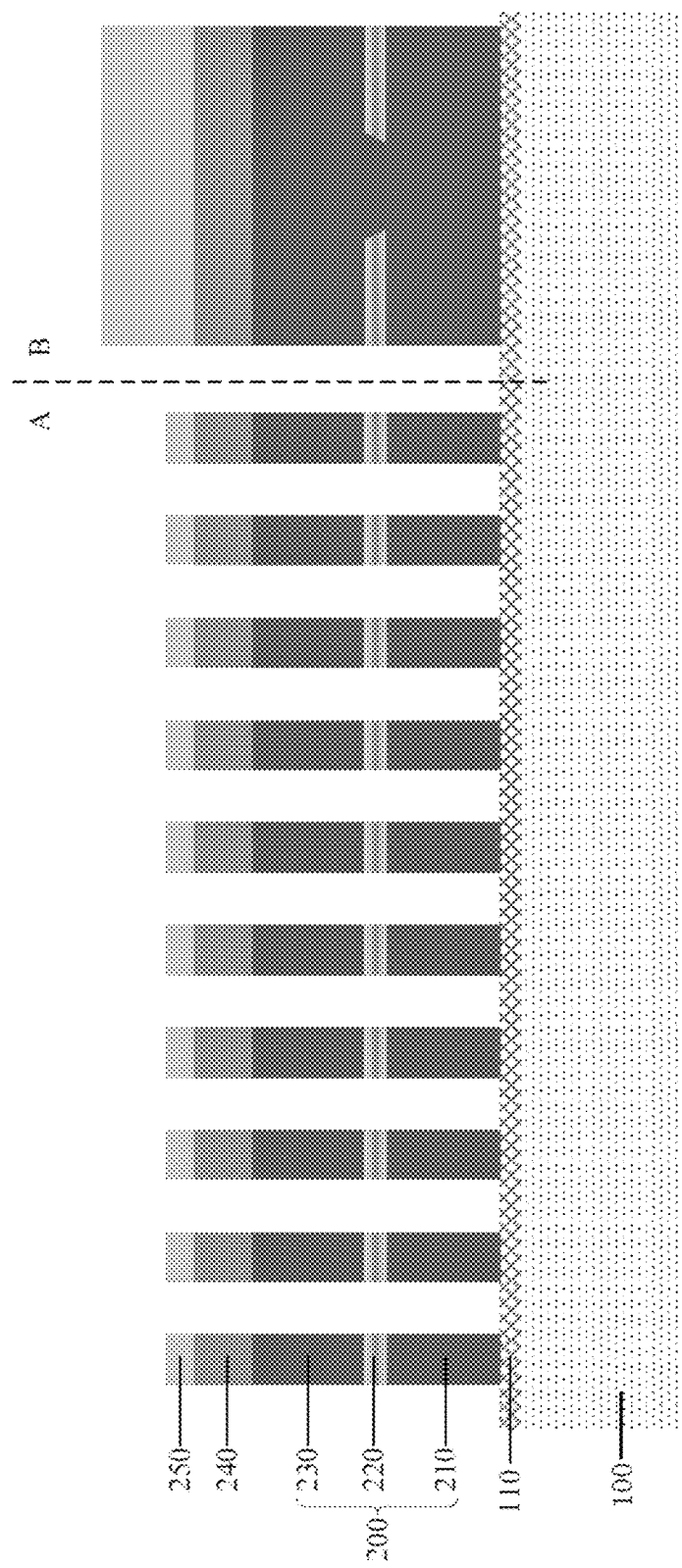

The manufacturing method provided by one embodiment of the present disclosure will be described in conjunction with FIGS. 3A-3J. First, FIG. 3A shows a structure formed after gate patterning, that is, executing step S110 of providing a substrate 100 including stacked gates 200 of storage transistors. Specifically, as shown in FIG. 3A, a gate dielectric layer 110 is formed on the upper surface of the substrate 100, and the stacked gates are located above the gate dielectric layer 110. In FIG. 3A the size of each one of the stacked gates 200 for selective transistors in the storage region A is much smaller than the size of one stacked gate as a peripheral device in the peripheral region B. Therefore, the stacked gates of the storage transistors in the storage region A each has a larger height to width aspect ratio.

In the above embodiment, it is understandable that the substrate 100 may employ a substrate having a material which may be an elemental semiconductor material, a compound semiconductor material and/or an alloy semiconductor material. Examples of the elemental semiconductor material may be, but are not limited to, crystalline silicon, polysilicon, amorphous silicon, germanium and/or diamond. Examples of the compound semiconductor material may be, but are not limited to, silicon carbide, gallium arsenide, gallium phosphide, indium phosphide, indium arsenide and/or indium antimonide. Examples of the alloy semiconductor material may be, but are not limited to, SiGe, GaAsP, AlInAs, AlGaAs, GaInAs, GaInP and GaInAsP.

The material of the gate dielectric layer 110 may employ a material, including, but not limited to, silicon oxide or high dielectric constant media. The stacked gate 200 includes polysilicon in a floating gate 210, an interlayer dielectric layer 220 (mainly composed of silicon oxide and silicon nitride), and polysilicon of a control gate 230 from bottom to top. According to the requirements of the process flow, a silicon nitride mask layer 240 and an insulating layer 250 (silicon oxide material) that is left after etching are further formed on the upper surface of the stacked gate 200. The stacked gate 200 and the silicon nitride mask layer 240 and insulating layer 250 thereon constitute a stacked film structure.

Then, referring FIGS. 3B-3F for the description of step S120: forming side walls on two sides of each stacked gate and the side walls are arranged to be lower than the stacked gates according to the manufacturing method provided by the present disclosure.

Figure 3B:
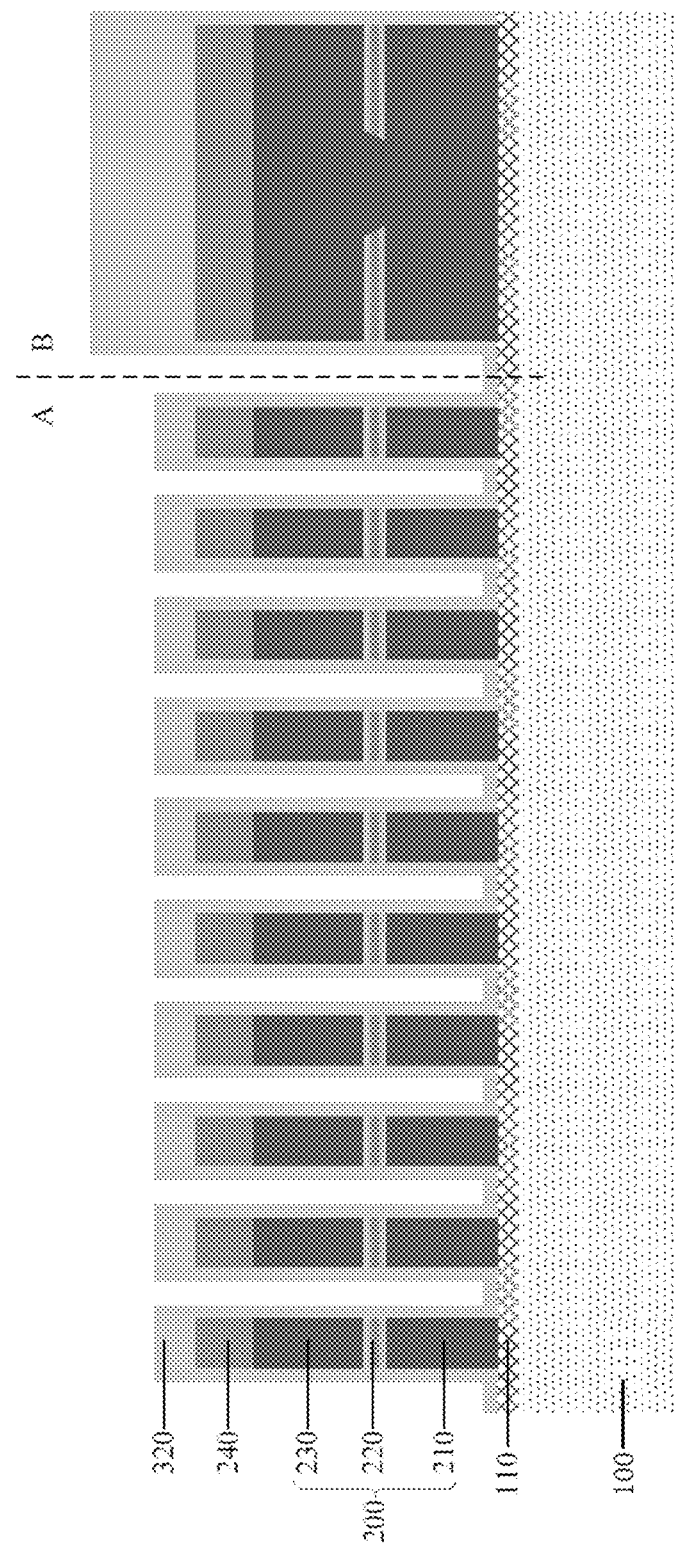

First, as shown in FIG. 3B, an insulating thin layer 320 is deposited to build the side walls, for example, an oxide layer is deposited on the side walls and the upper surface of the stacked film structure and the bottom surface between two adjacent stacked gates.

Figure 3C:
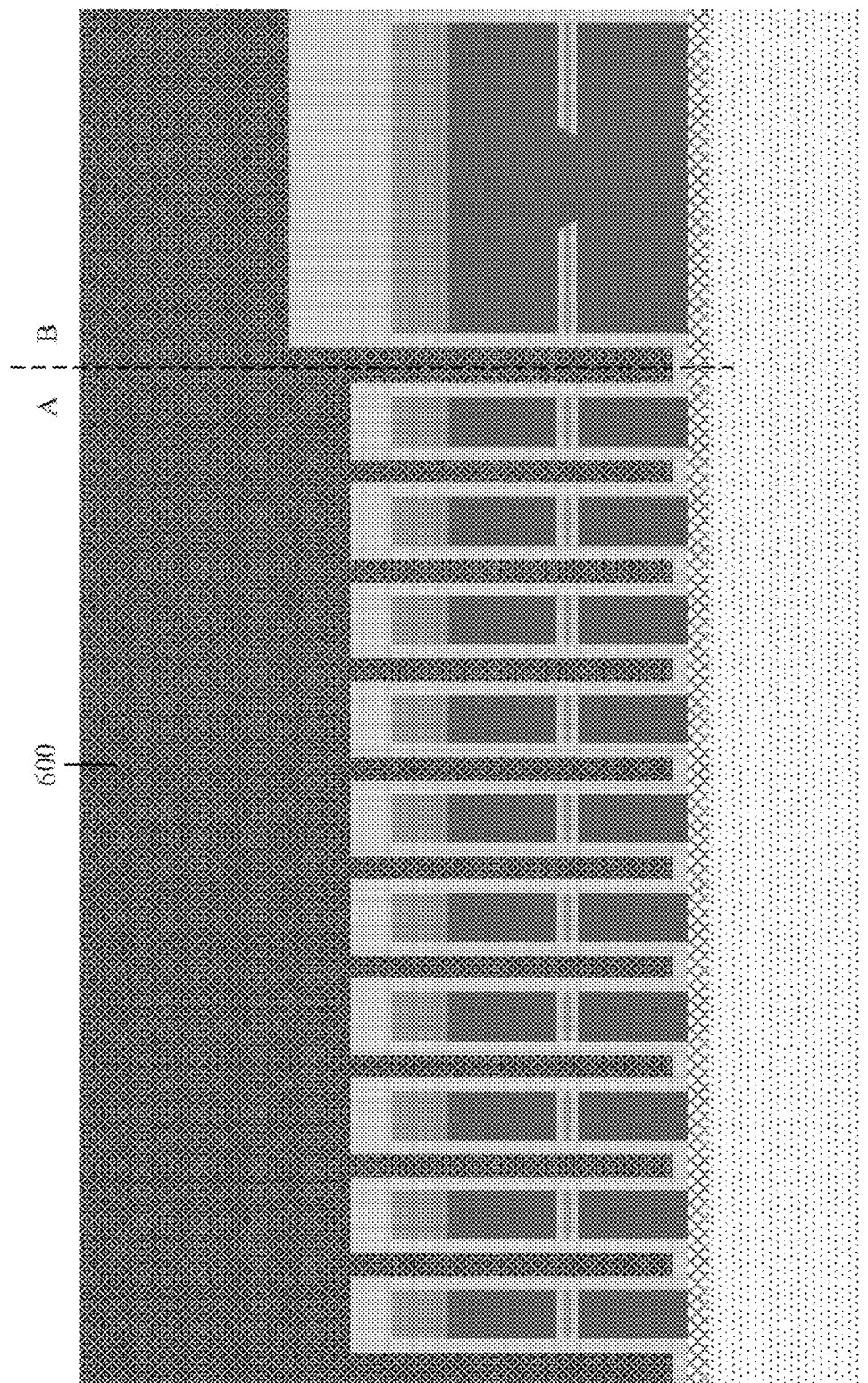

Then, as shown in FIG. 3C, an organic dielectric layer 600 is coated to form a barrier layer that completely fills the gaps between the plurality of stacked film structures and the barrier layer 600 is higher than the top surfaces of the stacked film structures. The material of the organic dielectric layer 600 possesses the characteristics of good filling performance, post-filling surface smoothness, and easy removal as needed. The organic dielectric material should fill the gaps well between the stacked film structures.

Figure 3D:
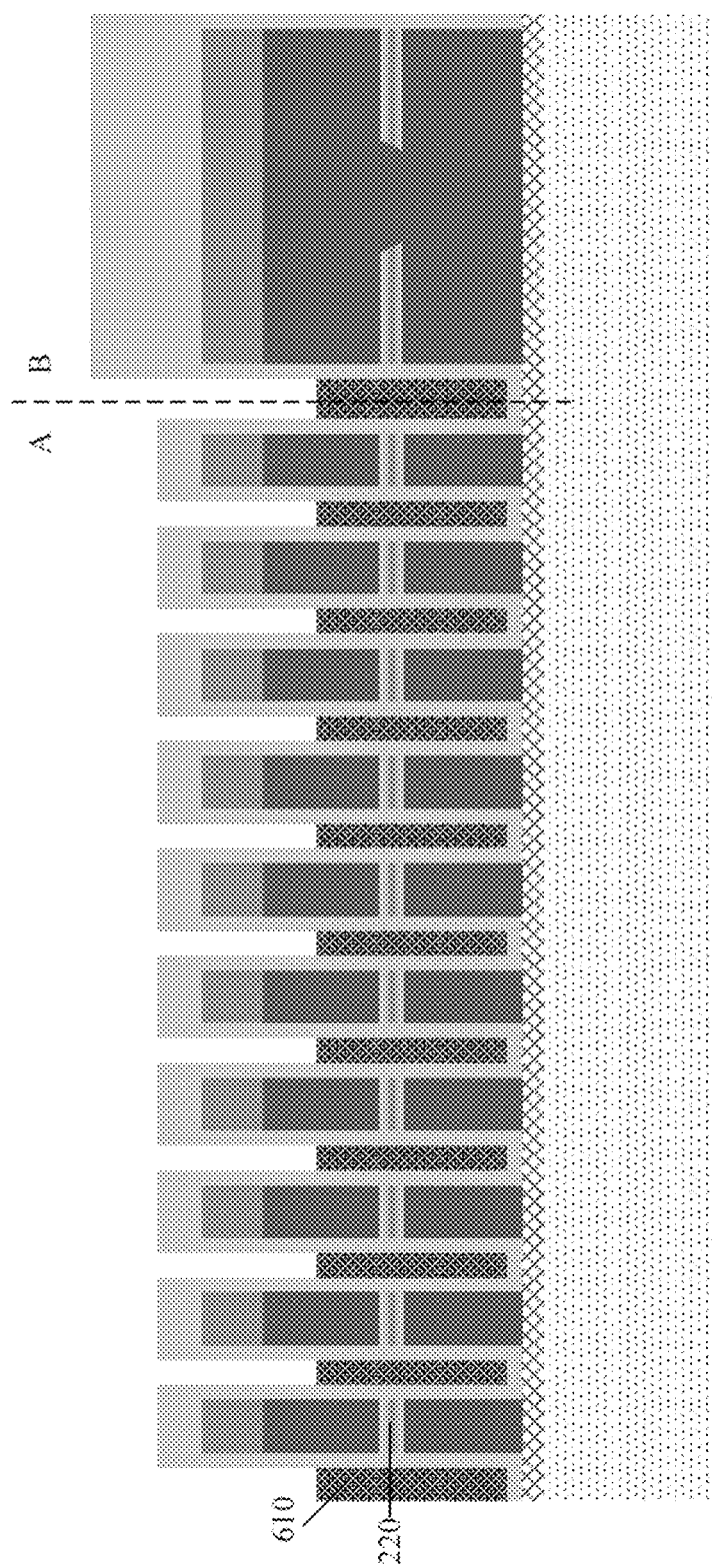

Subsequently, as shown in FIG. 3D, the organic dielectric layer 600 that fills the gaps between the stacked film structures is etched back, the remaining organic dielectric material retained after etching back forms a barrier layer 610 that is at the lower portion of each of the gaps between two adjacent ones of the plurality of stacked gates, and the top surface of the barrier layer 610 is above the interlayer dielectric layer 220. Typically, during the process of etching back the organic dielectric layer 600, the upper part of the organic dielectric layer can be etched by controlling the etching speed and the etching time.

Figure 3E:
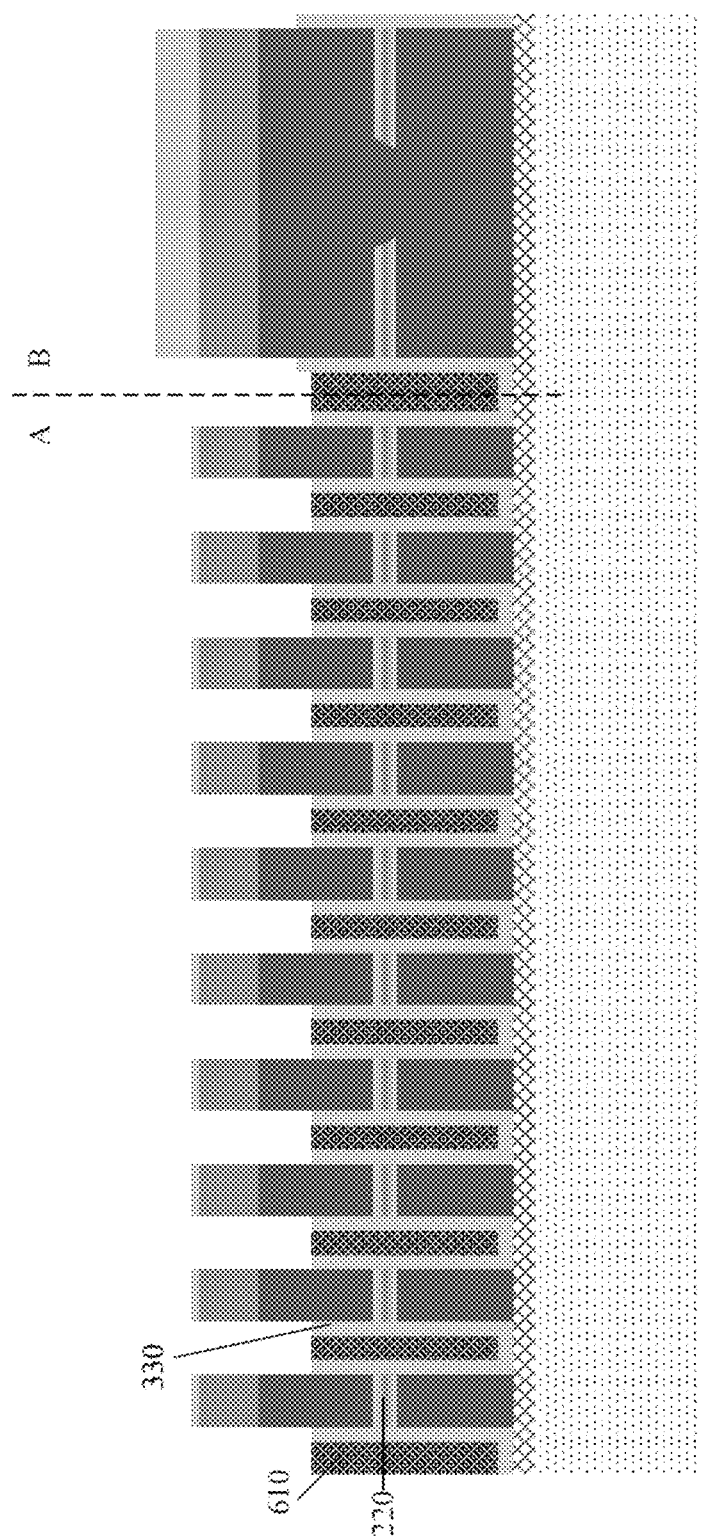
Figure 3F:
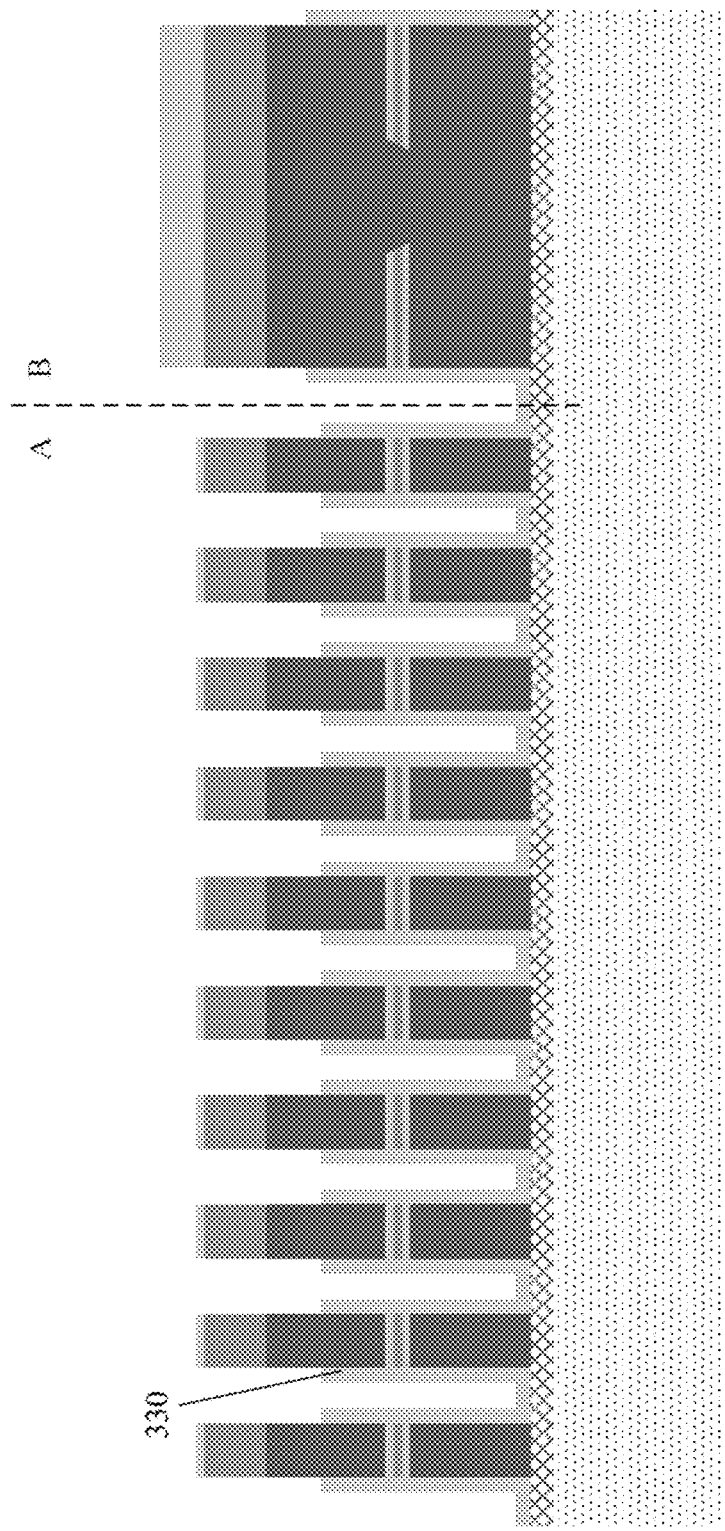

Next, as shown in FIG. 3E, the upper insulating thin layer is removed by a wet process, using the barrier layer 610 as a protective layer for the lower insulating thin layer. Since the interlayer dielectric layer 220 is protected by the barrier layer 610, the insulating thin layer outside the interlayer dielectric layer 220 is not removed. This part of insulating thin layer retained under the protection of the barrier layer 610 forms side walls 330 which have top surfaces lower than on the top surfaces of the two sides of each stacked gate, especially if the top surfaces of the side walls 330 are taller than the interlayer dielectric layer 220, as well as the spaces between the stacked gates. After the side walls 330 are formed, the barrier layer 610 is removed, as shown in FIG. 3F. Similarly, since the interlayer dielectric layer 220 is protected by the outer side walls 330, the interlayer dielectric layer 220 is not damaged in the step of removing the barrier layer 610.

In the above embodiment, a person skilled in the art can use an existing or future wet process to remove the insulating thin layer, and the specific implementation of the wet process should not improperly limit the protection scope of the present disclosure.

Understandably, the top surface of each of the side walls 330 is higher than the interlayer dielectric layer 220, therefore, can be used as a protective layer of the interlayer dielectric layer 220. The thickness of the bottom portion between the side walls 330 of the stacked gates, also formed of the thin dielectric layer as the side wall 330, also affects the gap size between a source/drain and the related gate. Because the insulating walls are formed on the bottom space between two adjacent stacked gates, crosstalk between the stacked gates can be reduced by a certain extent.

In addition, each of the side walls 330 further includes a horizontal portion which is over the gap between two of the stacked gates. In the subsequent process, the height of each of the side walls 330 on the side surfaces of the stacked gates can be used to determine the degree of formation of a metal silicide.

Figure 3G:
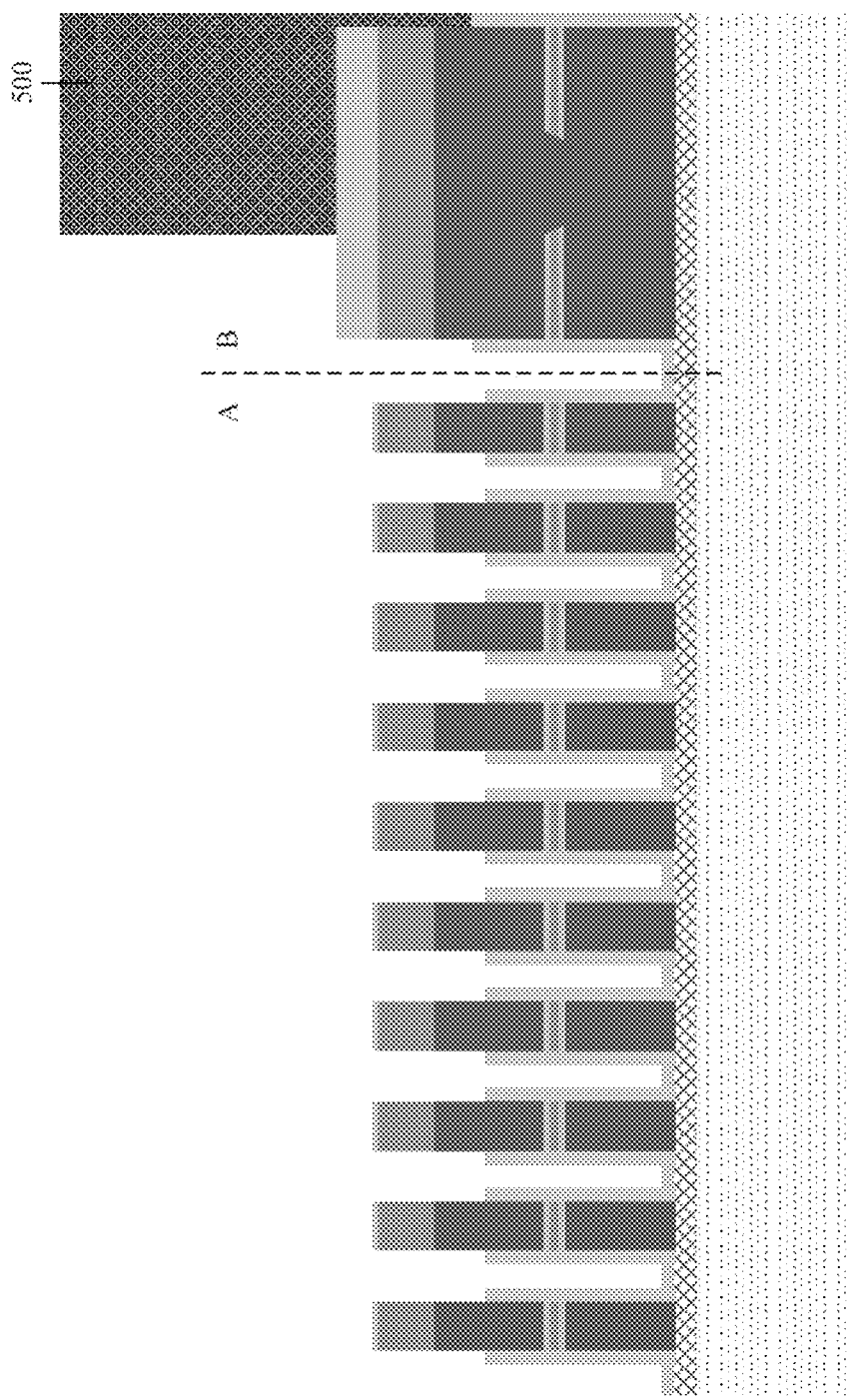
Figure 3H:
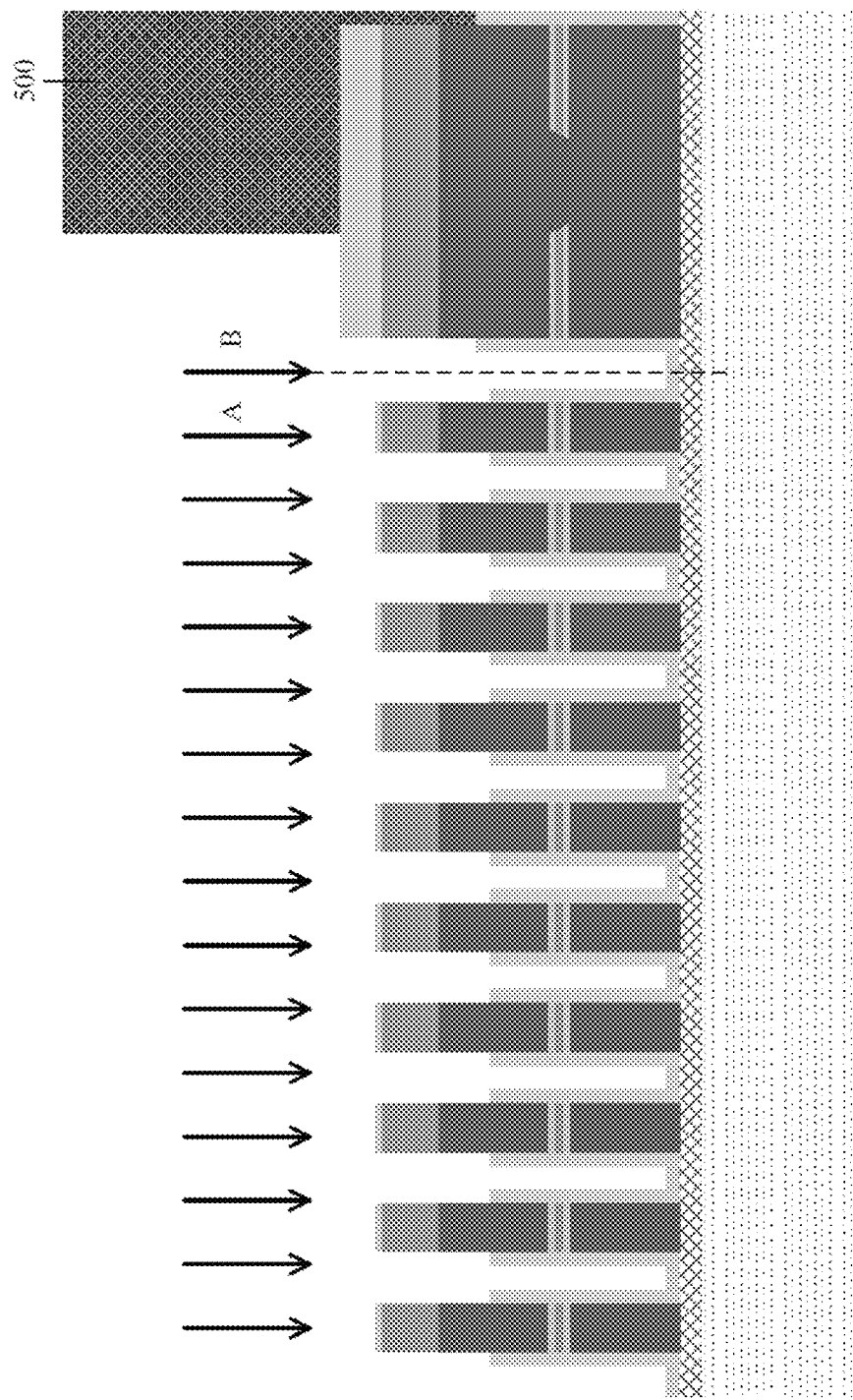

Subsequently, as shown in FIGS. 3G and 3H, a step S130 in FIG. 2 of ion implantation into the storage region A takes place. Specifically, as shown in FIG. 3G, coating with a photoresist 500 and patterning are required to protect the stacked gate as a peripheral device in the peripheral region B, while exposing the stacked gates as storage transistors and selective transistors in the storage region A. Then, as shown in FIG. 3H, ion implantation is performed on the storage region A where the photoresist is open. Understandably, in this step, the bottom surface of the thin film next to side walls 330 define ion implantation regions to a certain extent.

Later, as shown in FIG. 3I, the photoresist remaining after the ion implantation step needs to be removed, that is, step S140 in FIG. 2 is performed. In this step, an ashing process is first performed to remove most of the photoresist. Understandably, the ashing process involves an oxygen containing plasma reaction burns the photoresist to remove it. Then, a wet cleaning process is performed. The cleaning reagent 400 still fills the gaps between the stacked film structures, the insulating layer 250 of the silicon oxide material remaining above the stacked gates is still hydrophilic, but the insulating layer 250 remaining in the structure shown in FIG. 3I is thin, so the surface tension torque brought about by the cleaning reagent is small, which can effectively weaken the problem of torque imbalance on two sides of the stacked film structures, thereby mitigating the problem of the stacked gates collapse.

Meanwhile, in the above step of removing ion implantation residues, the outer edges of the interlayer dielectric layer 220 are protected by the side walls 330, which can ensure that the cleaning reagent 400 does not cause damage to the interlayer dielectric layer 220 in this step.

Figure 3J:
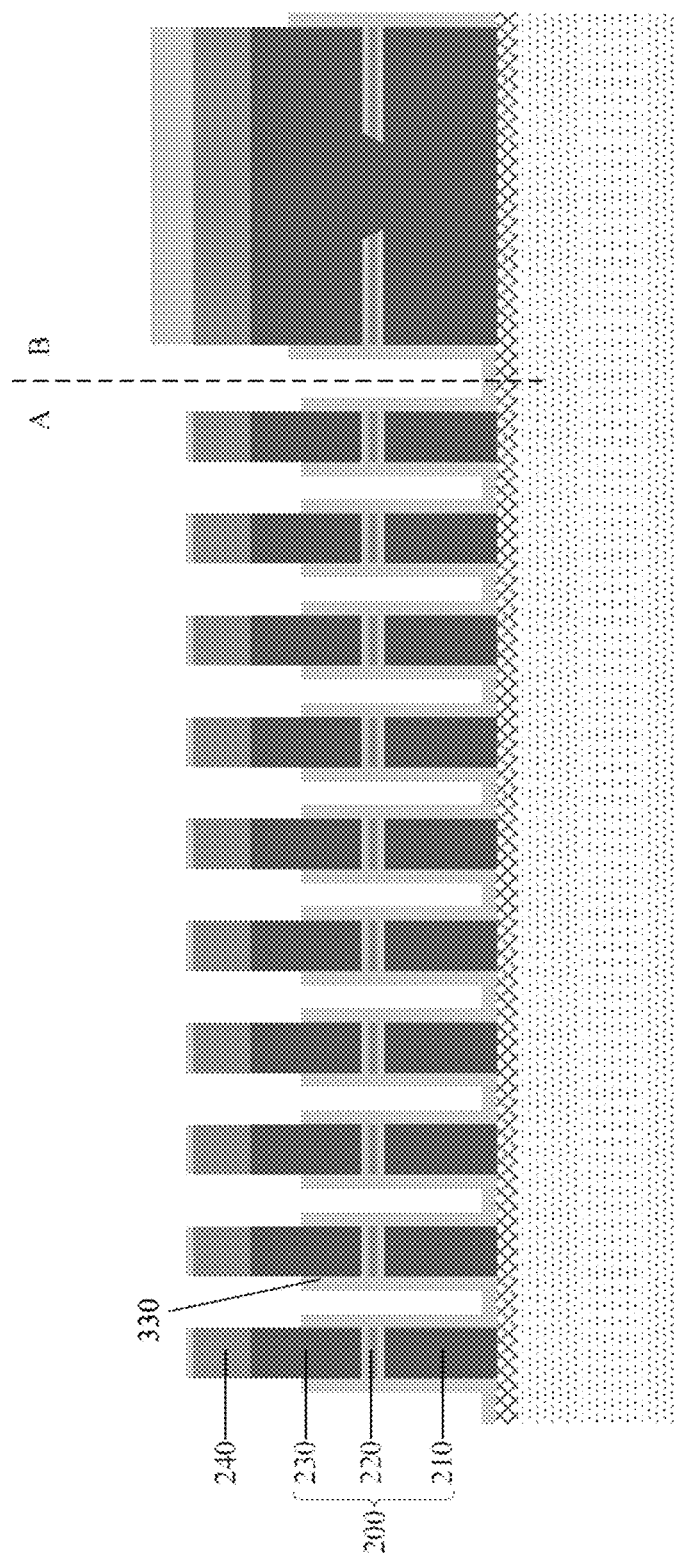

FIG. 3J shows a schematic structural diagram of a device after ion implantation residues are removed by wet cleaning in the manufacturing method provided by one embodiment of the present disclosure. It can be seen from FIG. 3J that the stacked gates 200 do not collapse.

So far, the specific implementation steps of the manufacturing method provided by one embodiment of the present disclosure are already described. The process flow provided by one embodiment of the present disclosure adds the process of removing the oxide layer on the upper of the stacked gates relative to the existing process flow, which ensures that the interlayer dielectric layer and its side and lower oxide layers are not affected while removing the oxide layer on the tops of the stacked gates. Thus, the interlayer dielectric layer is protected from being affected by the subsequent wet cleaning process, and the torque produced by the wet reagent on the stacked gates is reduced, thereby avoiding the problem of collapse of the stacked gates. Because the side wall oxide layer at the bottoms of the stacked gates is retained, the subsequent ion implantation process will not be significantly affected.

Another aspect of the present disclosure further provides a semiconductor device formed by the manufacturing method of the present disclosure, that is, a flash device. Since the semiconductor device is formed by the manufacturing method of the present disclosure, while the interlayer dielectric layer between the floating gates and the control gates is not damaged, the problem of gate collapse of storage transistors of the device can be effectively eliminated, and the yield of the semiconductor device formed can be effectively ensured.

Therefore, the embodiments of the device and the manufacturing method thereof according to the present disclosure are already described. According to the method for manufacturing a semiconductor device provided by the present disclosure, the process flow is optimized. Compared with the prior art, the interlayer dielectric layer is protected from being affected by the subsequent wet cleaning process, and the torque produced by the wet cleaning reagent on the stacked gates is reduced, thereby avoiding the problem of collapse of the stacked gates. Meanwhile, since the side walls at the bottoms of the stacked gates are retained, the subsequent ion implantation process will not be significantly affected. According to the semiconductor device provided by another aspect of the present disclosure, the problem of collapse of the stacked gates is avoided, the interlayer dielectric layer can be protected, and the ion implantation is not affected, so the yield of the semiconductor device can be ensured.

Although the present disclosure is described with respect to specific exemplary embodiments, it would be apparent that various modifications and changes can be made to these embodiments without departing from the broader spirit and scope of the present disclosure. Therefore, this description and the accompanying drawings are considered to be illustrative but not restrictive.

It should be understood that this description would not be used to explain or limit the scope or significance of the claims. Moreover, in the foregoing detailed description, it can be seen that various features are combined together in a single embodiment for the purpose of simplifying the present disclosure. The method of the present disclosure should not be construed as reflecting the claimed embodiments require more features than those specifically listed in each claim. Conversely, as reflected in the appended claims, the creative subject matters are fewer than all features of a single embodiment disclosed. Accordingly, the appended claims are hereby incorporated in detailed descriptions, and each claim serves as an individual embodiment.

One embodiment or embodiments mentioned in this description are intended to be included in at least one embodiment of a circuit or method in conjunction with the specific features, structures, or characteristics described in the embodiment(s). The phrase "an embodiment" that appears everywhere in the description does not necessarily refer to the same embodiment.

What is claimed is:

1. A method for manufacturing a semiconductor device, comprising:
   providing a substrate comprising storage transistors in a storage region;
   forming a plurality of stacked gates for the storage transistors in the storage region on the substrate;
   forming side walls on two sides of each of the plurality of stacked gates, wherein a height of one of the side walls is lower than a top surface of said stacked gate;
   performing ion implantation in the storage region defined by the side walls; and
   performing an ashing process followed by a wet cleaning process using the side walls as protective layers for the plurality of stacked gates to remove a photoresist remaining after the ion implantation.

2. The manufacturing method according to claim 1, wherein the plurality of stacked gates comprises:
   a floating gate film, an interlayer dielectric layer and a control gate film sequentially formed from bottom to top over the substrate, wherein
   a top surface of one of the side walls is arranged to be higher than the interlayer dielectric layer.

3. The manufacturing method according to claim 1, wherein forming the side walls further comprises:
   forming an insulating thin layer on the top surface and two sides of each of the plurality of stacked gates;
   forming a barrier layer on a surface of the insulating thin layer, wherein the barrier layer fills a lower part of a gap between two adjacent ones of the plurality of stacked gates;
   etching the insulating thin layer on the top surfaces of the plurality of stacked gates and an upper part of the insulating thin layer on the two sides of said stacked gate, wherein the barrier layer serves as a protective layer; and
   removing the barrier layer;
   wherein the insulating thin layer protected by the barrier layer on lower part of the two sides of said stacked gate forms the side walls.

4. The manufacturing method according to claim 3, wherein forming the barrier layer further comprises:
   filling the gap between two adjacent ones of the plurality of stacked gates with the barrier layer, wherein a surface of the barrier layer is higher than one of the top surfaces of the plurality of stacked gates; and
   etching back a portion of the barrier layer and keeping another portion of the barrier layer at a lower part of the gap between said two adjacent stacked gates.

5. The manufacturing method according to claim 4, wherein the barrier layer comprises an organic dielectric layer.

6. The manufacturing method according to claim 3, wherein the insulating thin layer on the top surfaces of the plurality of stacked gates and the upper parts of the insulating thin layer on the two sides of said stacked gates is etched by means of a wet process.

7. The manufacturing method according to claim 3, wherein the insulating thin layer further comprises a horizontal portion disposed on a upper surface of an oxide layer on the substrate, wherein the horizontal portion is protected by the barrier layer.

8. The manufacturing method according to claim 3, wherein the insulating thin layer comprises silicon oxide.

9. The manufacturing method according to claim 1, wherein a reagent used for wet cleaning of the storage region fills the gaps between the plurality of stacked gates.

10. A semiconductor device, wherein the semiconductor device is manufactured by the manufacturing method according to claim 1.

* * * * *